US009245825B2

(12) United States Patent
Ramachandra et al.

(10) Patent No.: US 9,245,825 B2
(45) Date of Patent: Jan. 26, 2016

(54) I/O PIN CAPACITANCE REDUCTION USING TSVS

(71) Applicant: SANDISK TECHNOLOGIES INC., Dallas, TX (US)

(72) Inventors: Venkatesh Ramachandra, San Jose, CA (US); Farookh Moogat, Fremont, CA (US)

(73) Assignee: SANDISK TECHNOLOGIES INC., Plano, TX (US)

(*) Notice: Subject to any disclaimer, the term of this patent is extended or adjusted under 35 U.S.C. 154(b) by 130 days.

(21) Appl. No.: 14/161,691

(22) Filed: Jan. 23, 2014

(65) Prior Publication Data
US 2015/0206824 A1 Jul. 23, 2015

(51) Int. Cl.
*H01L 23/48* (2006.01)
*H01L 25/065* (2006.01)
*G11C 16/06* (2006.01)
*H01L 23/00* (2006.01)

(52) U.S. Cl.
CPC .............. *H01L 23/481* (2013.01); *G11C 16/06* (2013.01); *H01L 25/0657* (2013.01); *H01L 24/05* (2013.01); *H01L 24/16* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/0557* (2013.01); *H01L 2224/16145* (2013.01); *H01L 2224/16225* (2013.01); *H01L 2224/32145* (2013.01); *H01L 2224/48091* (2013.01); *H01L 2224/48147* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01); *H01L 2924/1434* (2013.01); *H01L 2924/1436* (2013.01); *H01L 2924/1438* (2013.01); *H01L 2924/1443* (2013.01)

(58) Field of Classification Search
CPC ....................................................... G11C 16/06
See application file for complete search history.

(56) References Cited

U.S. PATENT DOCUMENTS

| 8,368,422 | B1* | 2/2013 | Dale | ................ | H03K 19/00346 |
| | | | | | 324/73.1 |
| 8,373,268 | B2 | 2/2013 | Upadhyayula | | |
| 8,399,298 | B2 | 3/2013 | Wu | | |
| 8,415,808 | B2 | 4/2013 | Liao | | |
| 8,525,343 | B2 | 9/2013 | Yu | | |
| 8,674,491 | B2* | 3/2014 | Liu | ................ | H01L 257/678 |
| | | | | | 257/678 |
| 2010/0246152 | A1* | 9/2010 | Lin | ................ | H01L 21/563 |
| | | | | | 361/783 |
| 2011/0090004 | A1 | 4/2011 | Schuetz | | |
| 2012/0038057 | A1* | 2/2012 | Bartley | ................ | H01L 23/3677 |
| | | | | | 257/774 |

(Continued)

*Primary Examiner* — Lex Malsawma
(74) *Attorney, Agent, or Firm* — Vierra Magen Marcus LLP

(57) ABSTRACT

Methods for reducing pin capacitance and improving off-chip driver performance by using TSVs to enable usage of off-chip drivers located within selected and unselected die of a plurality of stacked die are described. A reduction in pin capacitance allows for faster switching times and/or lower power operation. In some embodiments, a TSV may connect an internal node (e.g., the output of a pre-driver) within a selected die of a plurality of stacked die with the input of an off-chip driver within an unselected die of the plurality of stacked die. In some cases, only a single die within a die stack may be selected (or enabled) at a given time. Using a TSV to connect internal nodes associated with off-chip drivers located within both selected and unselected die of the die stack allows for reduced off-chip driver sizing and thus reduced pin capacitance.

19 Claims, 13 Drawing Sheets

(56) References Cited

U.S. PATENT DOCUMENTS

| | | | |
|---|---|---|---|
| 2012/0098140 A1* | 4/2012 | Bartley | H01L 25/0657 257/774 |
| 2013/0070507 A1* | 3/2013 | Yoon | G11C 7/1057 365/51 |
| 2013/0169343 A1 | 7/2013 | Gillingham | |
| 2013/0262744 A1 | 10/2013 | Ramachandra | |

* cited by examiner (Prior Art)

(Prior Art)

I/O PIN CAPACITANCE REDUCTION USING TSVS

BACKGROUND

Semiconductor memory is widely used in various electronic devices such as mobile phones, digital cameras, personal digital assistants, SSDs, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

It is common for semiconductor memory die to be placed into a package to allow for easier handling and assembly, and to protect the die from damage. Although a plural form of "die" is "dice," it is common industry practice to use "die" as a plural form as well as the singular form. In one example, semiconductor memory die and/or other integrated circuits, such as processors, may be encased within a package wherein the die may be stacked on top of one another within the package. The package may comprise a surface-mount package (e.g., a BGA package or TSOP package). One benefit of vertically stacking die within a package (e.g., stacking 16 die within a single package) is that form factor and/or package size may be reduced. In some cases, the package may comprise a stacked multi-chip package, a system-in-package (SiP), or a chip stack multichip module (MCM). Vertical connections between the stacked die including direct vertical connections through a die's substrate (e.g., through a silicon substrate) may be formed within each die before or after die-to-die bonding. In some cases, the vertical connections may comprise through-silicon vias (TSVs).

FIGS. 1-3 depict various embodiments of a semiconductor package 20 including a plurality of stacked die. As depicted, a plurality of semiconductor die, such as die 22, 24, and 34 may be mounted to a substrate 26 and encased within the semiconductor package 20. In one example, each of die 22, 24, and 34 may comprise a semiconductor memory die. In another example, die 22 may comprise a flash memory die and die 24 may comprise a memory controller. In some embodiments, the number of vertically stacked die within a package may comprise more than two die (e.g., 16, 32, or 64 die within the package). Each of the semiconductor die may include bond pads on an upper surface of the die for allowing electrical access to integrated circuitry within the die. Each bond pad may correspond with an input pin, an output pin, or an input/output (I/O) pin that connects to the integrated circuitry. Wire bonding connections, such as bond wires 30, may be used to electrically connect a die with other die within the package or to substrate 26. The bond wires 30 may comprise a metal such as copper, aluminum, or gold.

As depicted in FIG. 1, two or more semiconductor die may be stacked directly on top of each other, thereby taking up a small footprint on the substrate 26. However, in a vertically stacked configuration without TSVs, space must be provided between adjacent semiconductor die for the bond wire connections. A dielectric spacer layer 33 may be used to provide space for the bond wires 30 to be bonded to bond pads on the lower die 24. As depicted in FIGS. 2-3, instead of stacking die directly above each other, each of the stacked semiconductor die may be offset such that the bond pads on one side of each die are exposed.

DETAILED DESCRIPTION

Figure 1:
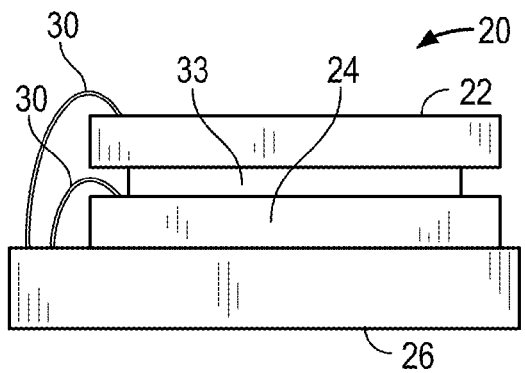
FIGS. 1-3 depict various embodiments of a semiconductor package including a plurality of stacked die.
Figure 2:
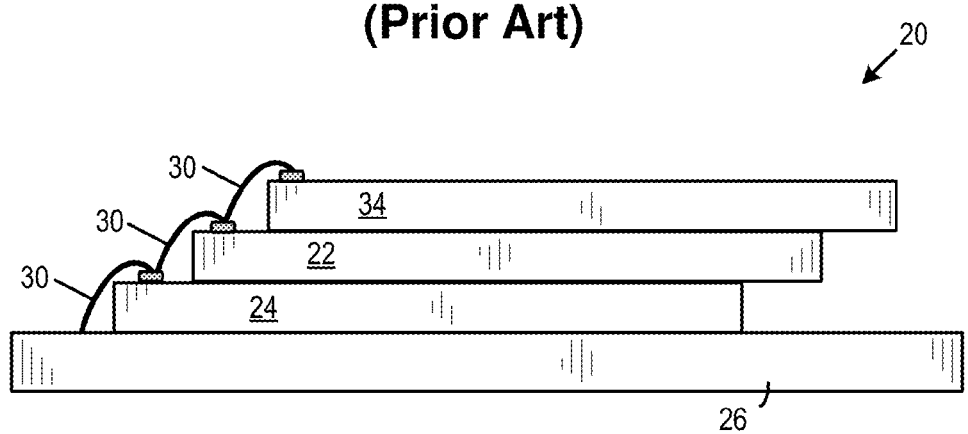
Figure 3:
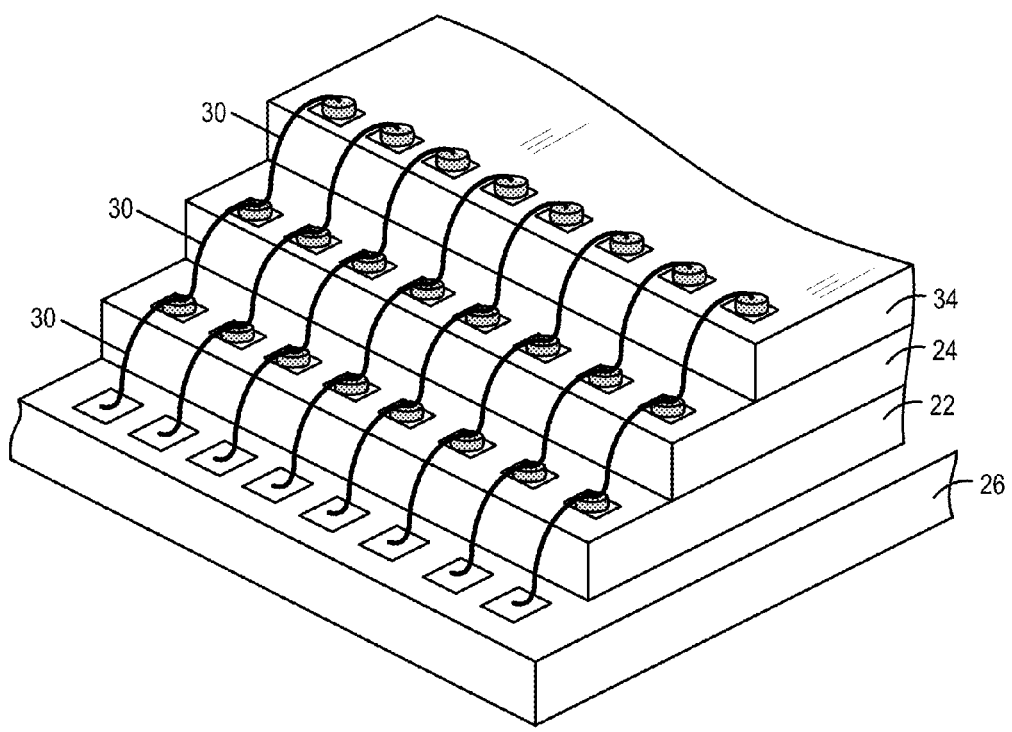

Technology is described for reducing pin capacitance and improving off-chip driver performance by using through-silicon vias (TSVs) to enable usage of off-chip drivers located within selected and unselected die of a plurality of stacked die. A reduction in pin capacitance allows for faster switching times and/or lower power operation. Currently in a multi die stack only the pre driver and off chip driver of the selected die is enabled. Off chip drivers on unselected die are not used and causes large pin cap. In some embodiments, a TSV may connect an internal node (e.g., the output of a pre-driver) within a selected die of a plurality of stacked die with the input of an off-chip driver within an unselected die of the plurality of stacked die. In some cases, only a single die within a die stack may be selected (or enabled) at a given time. Using a TSV to connect internal nodes associated with off-chip drivers located within both selected and unselected die of the die stack allows for reduced off-chip driver sizing and thus reduced pin capacitance. The reduction in pin capacitance may allow for an increase in the number of die within a die stack (i.e., more die may be vertically stacked)

In some embodiments, to minimize crowbar current or shoot-through current caused by timing discrepancies between the off-chip drivers associated with the selected and unselected die in a die stack, adjustable delay lines may be added to the input paths of the off-chip drivers. In one embodiment, the input signal timing to each off-chip driver may be adjusted based on the location of the selected die within a stacked die configuration. For example, the adjustable timing delays for each of the delay lines when the selected die is the bottom die in the stacked die configuration may be different from the adjustable timing delays for each of the delay lines when the selected die is the top die or a middle die in the stacked die configuration. In another embodiment, the input signal timing for a particular off-chip driver may be adjusted based on the location of the selected die within a die stack and process variation data associated with the die associated with the particular off-chip driver. The process variation data may identify whether a die was part of a fast lot or a slow lot. In some cases, the adjustable delay lines in both selected and unselected die may be adjusted such that the off-chip drivers receive input signals at substantially the same time. In one example, a first delay line associated with a selected die may be set such that the delay from a pre-driver within the selected die to the input of an off-chip driver on the selected die comprises the worst-case signal delay from the pre-driver within the selected die to the input of the farthest off-chip driver located on an unselected die (i.e., the off-chip driver with the latest arriving input signal); thus, the first delay line may be used to synchronize the input signal timings for the off-chip driver located on the selected die and the farthest off-chip driver located on an unselected die (i.e., the off-chip driver that has the latest arriving input signal). The electrical connection from the pre-driver within the selected die to each of the corresponding off-chip drivers located on the unselected die may be formed using one or more TSVs.

One issue involving the stacking of die within a die stack is that the pin capacitance for a commonly connected pin among each die in the die stack increases with the number of die within the die stack. For example, in a die stack comprising 16 die, an off-chip driver of the one selected die out of the 16 total die may have to drive pin capacitance associated with each of the off-chip drivers from each of the 16 total die. As pin capacitance may be dominated by the size of the off-chip drivers and a limiting factor to the maximum number of stacked die within a package, there is a need to minimize the pin capacitance associated with off-chip drivers within selected and unselected die within a stacked die configuration.

The increase in pin capacitance for a commonly connected pin among each die in a die stack (or among a subset of die in the die stack) impacts both input pins and output pins. For input pins, on-die termination (ODT) may be used. ODT refers to the placement of one or more termination resistors (e.g., for impedance matching purposes) within a die. In cases where ODT structures are included within two or more die in a die stack, the ODT structures may be shared across both the selected and unselected die within the die stack. A metal-layer masking change (e.g., via a top metal layer change) may be used to enable or set a particular number of resistors (or a particular resistance value) within each die of the die stack. For example, in the case of a two-die stack, both die may use a first metal layer mask to provide a combined 100 ohm termination by setting the ODT structures in each die to provide a 200 ohm termination. In the case of a four-die stack, the first metal layer mask may be updated to provide a combined 100 ohm termination by setting the ODT structures in each die to provide a 400 ohm termination.

Figure 4A:
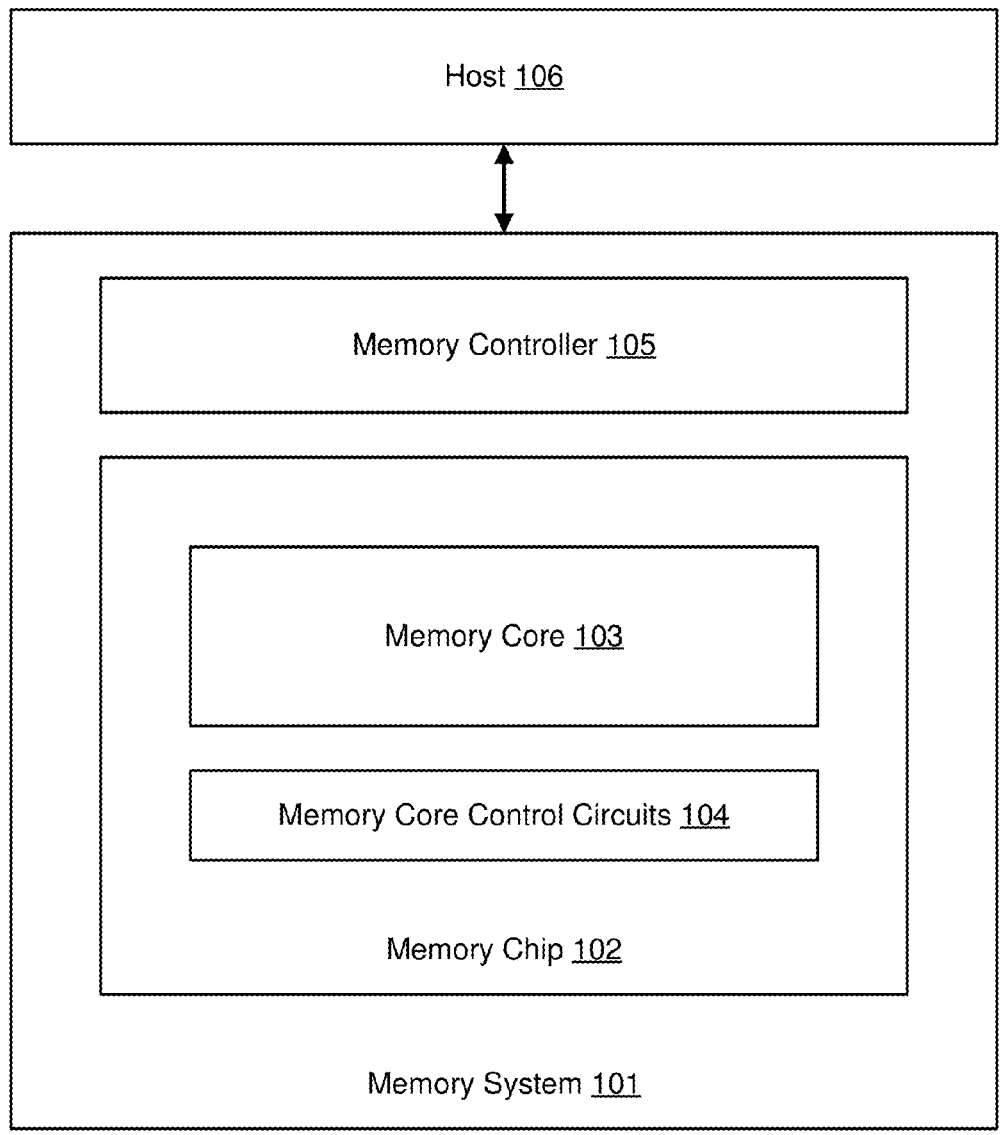
FIG. 4A depicts one embodiment of a memory system and a host.

FIG. 4A depicts one embodiment of a memory system 101 and a host 106. The host 106 may comprise a computing device (e.g., a personal computer, audio player, digital camera, or mobile computing device) or a storage device (e.g., an enterprise storage device). The memory system 101 may comprise a memory card, a flash drive, a system on a chip (SOC), or an embedded memory system. In one embodiment, the memory system 101 may be embedded within a multi-chip package. As depicted, the memory system 101 includes a memory controller 105 and a memory chip 102. In some cases, a memory system, such as memory system 101, may include more than one memory chip. In one example, the memory system 101 may include 16 NAND die stacked within a multi-chip package. The memory controller 105 may include one or more state machines, control logic, page registers, non-volatile memory, SRAM, or other circuitry for controlling the operation of memory chip 102. The one or more state machines, control logic, page registers, non-volatile memory, SRAM, and/or other circuitry for controlling the operation of the memory chip 102 may be referred to as managing or control circuits. The managing or control circuits may be used to facilitate one or more memory array operations associated with the memory chip 102 including erasing, programming, and reading operations. The memory controller 105 may receive data and commands from host 106 and provide memory chip data to host 106. In some embodiments, the memory controller 105 and memory chip 102 may be arranged on a single integrated circuit. In other embodiments, memory controller 105 and memory chip 102 may be arranged on different integrated circuits.

In one embodiment, the memory system 101 may include a plurality of memory die vertically stacked within a multi-chip package. Each of the memory die may include one or more TSVs to enable usage of off-chip drivers located within selected and unselected die of the vertically stacked die. In another embodiment, a multi-die stack may comprise a plurality of NAND die and a DRAM (or other integrated circuit different from a NAND die). In this case, the one or more TSVs may enable usage of off-chip drivers located within the plurality of NAND die but not extend through to the DRAM. Thus, the TSVs may allow vertical connections to extend through to only a subset of the die within the multi-die stack.

As depicted, the memory chip 102 includes memory core control circuits 104 and memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. The memory cells may comprise floating-gate transistors or non-volatile memory technologies that employ charge trapping, phase-change (e.g., chalcogenide materials), or state-change materials. In one embodiment, the memory core control circuits 104 and memory core 103 are arranged on a single integrated circuit. In other embodiments, the memory core control circuits 104 and memory core 103 may be arranged on different integrated circuits.

Referring to FIG. 4A, a memory system operation may be initiated when host 106 sends instructions to memory controller 105 indicating that it would like to read data from memory system 101 or write data to memory system 101. In the event of a write (or programming) operation, host 106 may send to memory controller 105 both a write command and the data to be written. The data to be written may be buffered by memory controller 105 and error correcting code (ECC) data may be generated corresponding with the data to be written. The ECC data, which allows data errors that occur during transmission or storage to be detected and/or corrected, may be written to memory core 103 or stored in non-volatile memory within memory controller 105. In one embodiment, the ECC data is generated and data errors are corrected by circuitry within memory controller 105.

In some cases, the operation of memory chip 102 may be controlled by memory controller 105. In one example, before issuing a write operation to memory chip 102, memory controller 105 may check a status register to make sure that memory chip 102 is able to accept the data to be written. In another example, before issuing a read operation to memory chip 102, memory controller 105 may pre-read overhead information associated with the data to be read. The overhead information may include ECC data associated with the data to be read or a redirection pointer to a new memory location within memory chip 102 in which to read the data requested. Once a read or write operation is initiated by memory controller 105, memory core control circuits 104 may generate the appropriate bias voltages for word lines and bit lines within memory core 103, as well as generate the appropriate memory block, row, and column addresses. The memory controller 105 may manage the translation (or mapping) of logical addresses received from the host 106 into physical addresses associated with the memory chip 102. The mapping tables for mapping the logical addresses corresponding with logical groups of data to physical address corresponding with memory locations within memory chip 102 may be stored within memory controller 105 or within memory chip 102.

In some embodiments, memory controller 105 may control one or more memory chips within a memory system. Each of the one or more memory chips may be organized into a plurality of memory blocks. In some cases, each of the one or more memory chips may be organized into a plurality of metablocks. A metablock may comprise a plurality of memory blocks. A memory block may comprise a group of memory cells that are erased concurrently (i.e., a unit of erase). In some cases, the group of memory cells may comprise a binary cache or a group of multi-level cells for storing user data. Each of the plurality of memory blocks may include a plurality of pages. A page may comprise a group of memory cells that may be accessed, programmed, and/or read concurrently. The group of memory cells within a page may share a common word line. In some cases, a memory block may comprise 32, 64, or 128 pages and each page may comprise 2 KB or 4 KB of data.

Figure 4B:
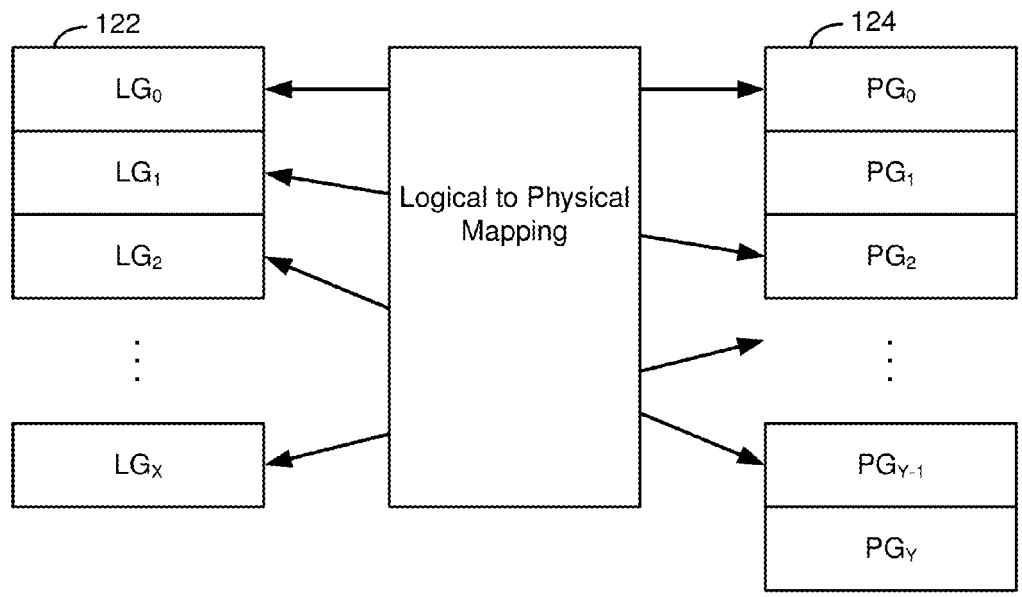
FIG. 4B depicts one embodiment of a mapping between logical groups and physical groups as performed by a memory system.

FIG. 4B depicts one embodiment of a mapping between logical groups and physical groups as performed by a memory system, such as memory system 101 in FIG. 4A. As depicted, each logical group of logical groups 122 (e.g., represented as a logical block address) is mapped to a unique physical group of physical groups 124 (e.g., represented as a memory block or page address). A logical group may be associated with a metablock, a page, or a portion of a page. In some cases, a logical group may comprise a grouping of one or more logical sectors which are mapped to a metablock. The logical to physical mapping between the logical groups and the physical groups may be stored in a table or list within a non-volatile memory, such as memory core 103 in FIG. 4A. In some cases, each logical group may be mapped to a metablock address. In one embodiment, a Group Address Table (GAT) may be used to store a mapping of metablock addresses for each logical group within a memory system.

Figure 4C:
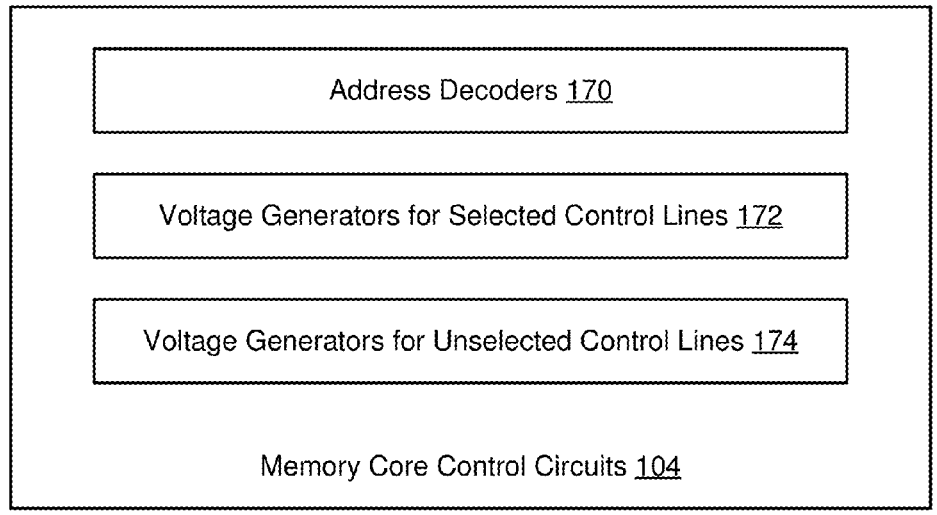
FIG. 4C depicts one embodiment of memory core control circuits.

FIG. 4C depicts one embodiment of memory core control circuits 104 in FIG. 4A. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 4D:
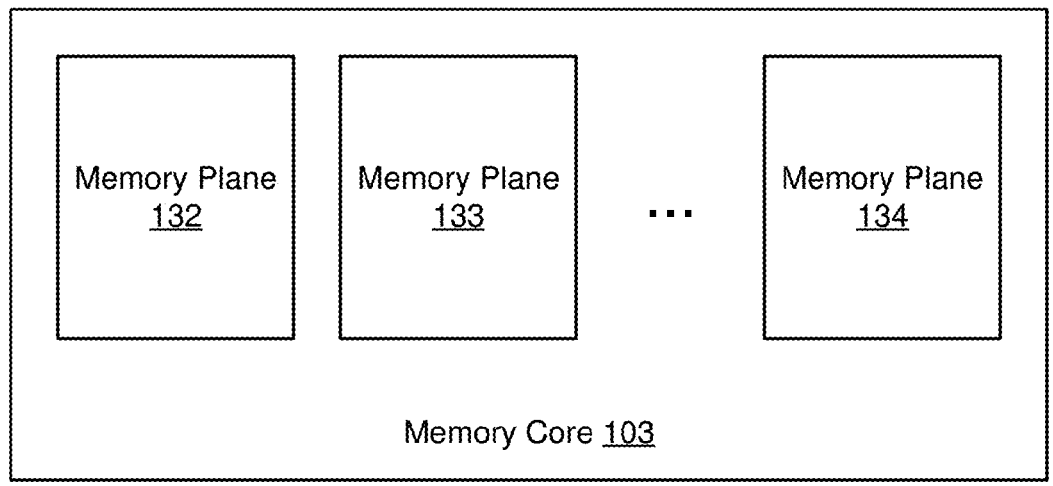
FIG. 4D depicts one embodiment of a memory core.

FIG. 4D depicts one embodiment of memory core 103 in FIG. 4A. As depicted, memory core 103 includes memory planes 132-134. In some embodiments, the number of memory planes (or bays) per memory core can be different for different implementations. For example, a memory core may include only a single memory plane or a plurality of memory plane (e.g., 16 memory bays). Each memory plane may comprise one or more memory blocks. Each memory block may comprise one or more memory cells. In some cases, multiple memory planes may be operated in parallel to increase read and/or write bandwidth. Although a memory core organization is depicted where memory planes comprise memory blocks, and memory blocks comprise a group of memory cells, other organizations or groupings can also be used with the technology described herein.

Figure 4E:
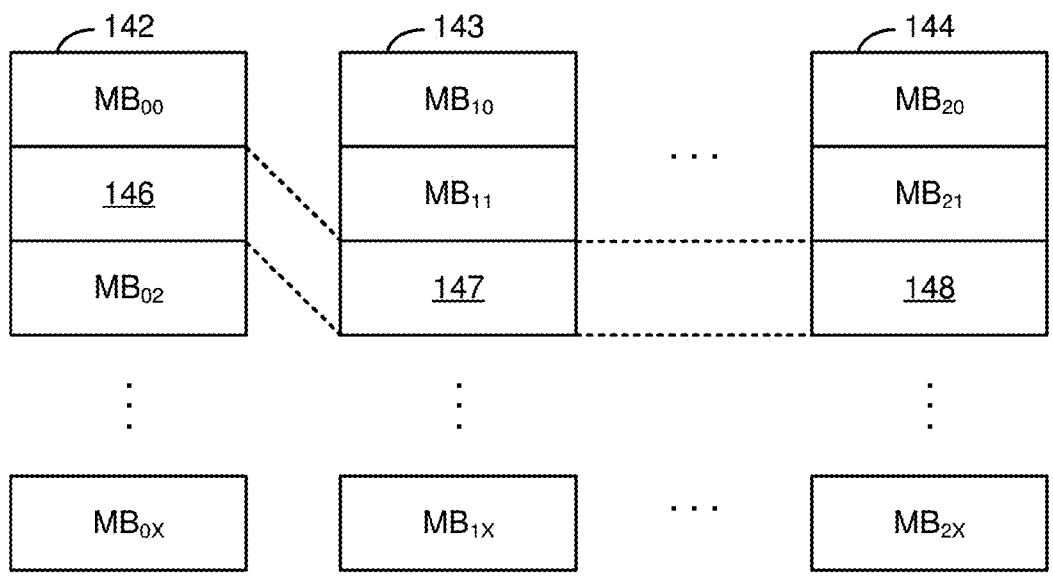
FIG. 4E depicts one embodiment of a memory core organization including a plurality of memory planes.

FIG. 4E depicts one embodiment of a memory core organization including a plurality of memory planes. The memory planes 142-144 each comprise a plurality of physical groups. Each physical group may comprise a memory block (e.g., memory block $MB_{00}$). In some cases, memory blocks across the plurality of physical groups may be linked together to form a metablock. For example, memory blocks 146-148 may be linked together to form a metablock. As depicted, the memory blocks used to form a metablock may be from various locations within their respective memory planes. For example, memory block 146 from memory plane 142, memory block 147 from memory plane 143, and memory block 148 from memory plane 144 may be linked together to form a metablock or a portion of a metablock. As each of the memory blocks may include a plurality of pages, a metapage extending across each of the memory planes 142-144 may be created by linking pages from each of the memory blocks within a metablock together. In some embodiments, a subset of the memory blocks within a memory plane may correspond with one or more spare blocks.

Figure 5:
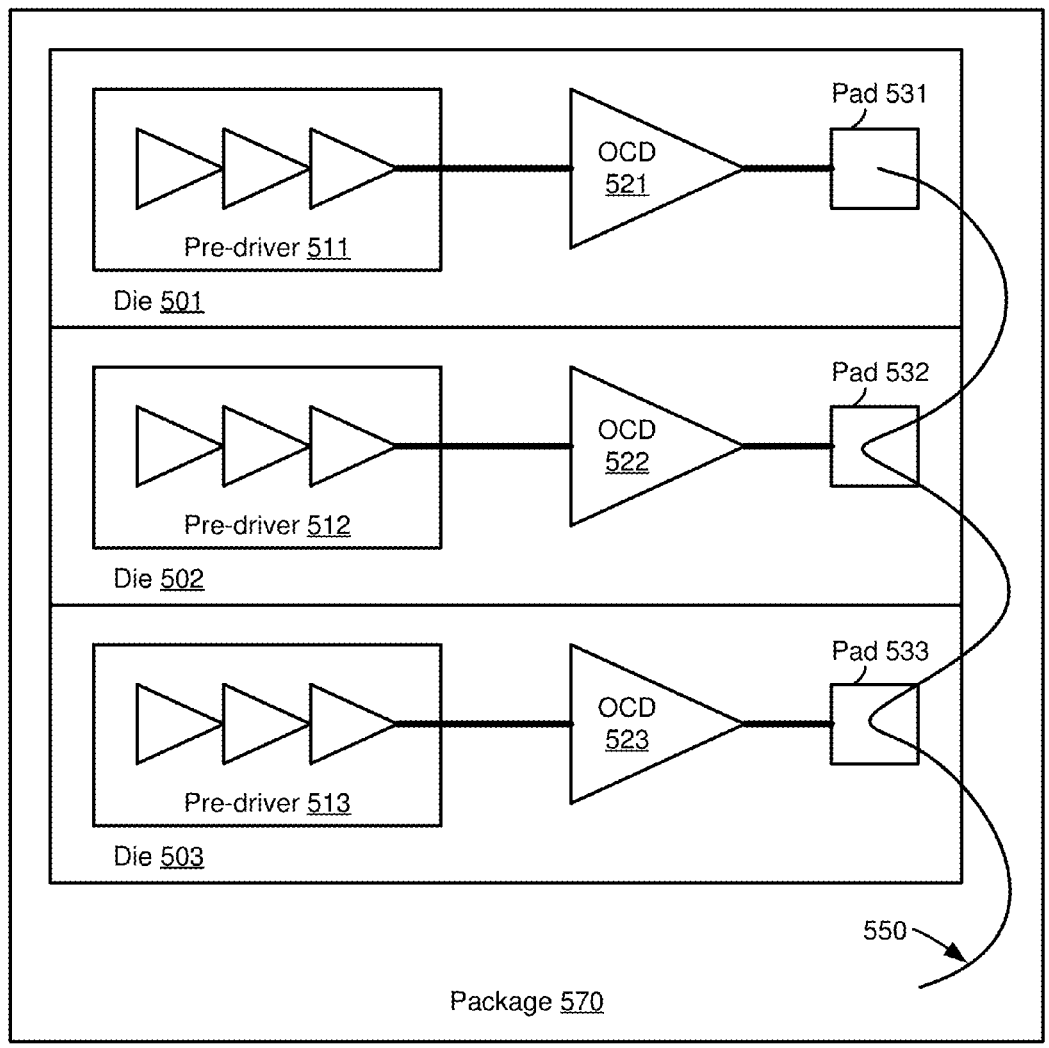
FIG. 5 depicts one embodiment of a portion of a system encased within a package.

FIG. 5 depicts one embodiment of a portion of a system, such as memory system 101 in FIG. 4A, encased within a package 570. The portion of the system comprises die 501-503 that are vertically stacked within the package 570. In some cases, the package 570 may comprise a BGA package or TSOP package. Die 501 includes a pre-driver 511 that drives an off-chip driver 521 that drives an output pad 531. Die 502 includes a pre-driver 512 that drives an off-chip driver 522 that drives an output pad 532. Die 503 includes a pre-driver 513 that drives an off-chip driver 523 that drives an output pad 533. A bond wire 550 may be used to connect the output pads 531-533 to each other and to other circuitry located within the package 570. One issue with the stacked die configuration depicted in FIG. 5 is that each off-chip driver located on a die must drive a capacitive load that is a function of the number of stacked die that share a common output node. For example, off-chip driver 521 drives an output load that includes capacitive contributions from the diffusion capacitances associated with off-chip drivers 522-523. In one example, each of the output drivers may contribute 3-4 pF to the total output capacitance.

Figure 6A:
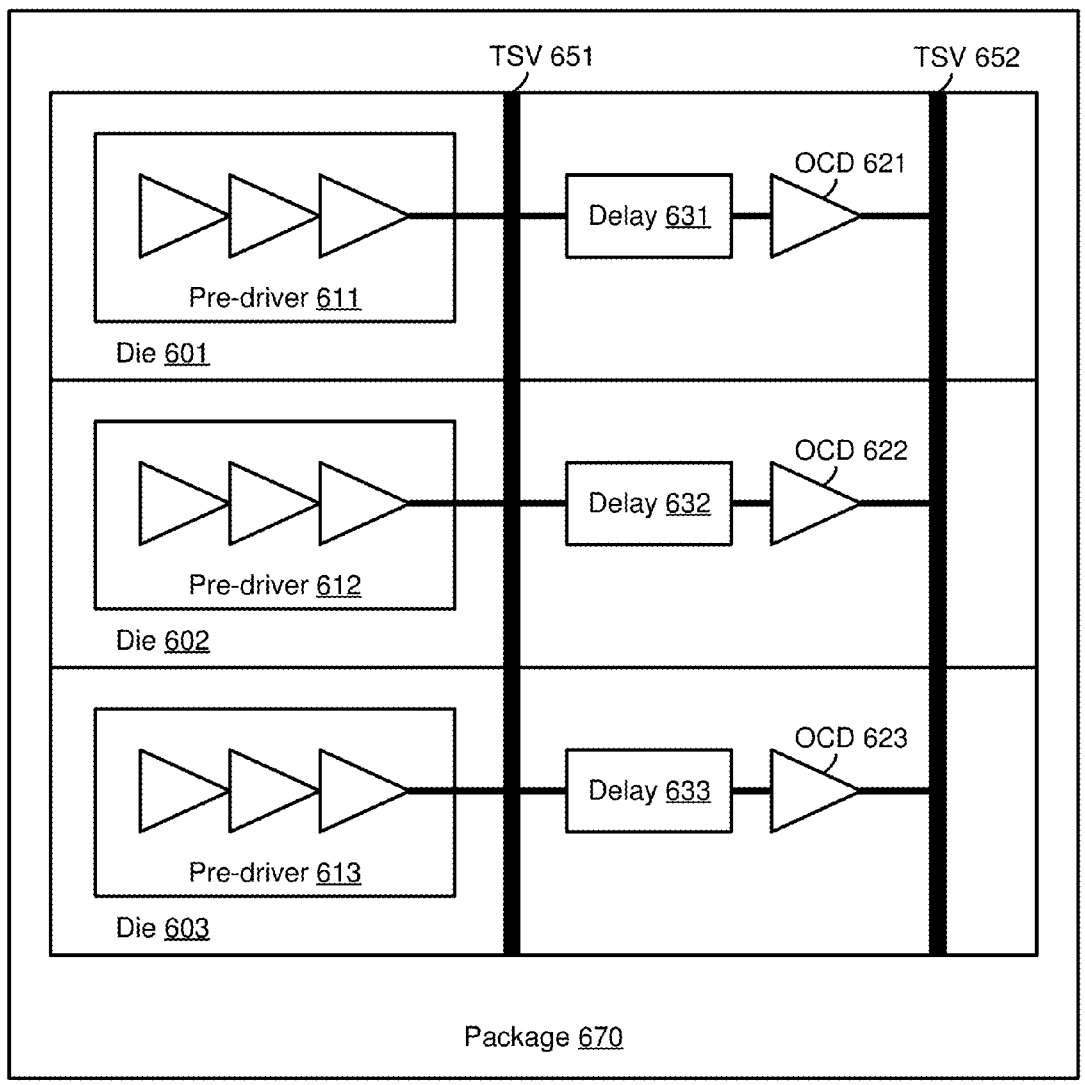
FIG. 6A depicts one embodiment of a portion of a system using TSVs.

FIG. 6A depicts one embodiment of a portion of a system, such as memory system 101 in FIG. 4A, encased within a package 670. The portion of the system comprises die 601-603 that are vertically stacked within the package 670. In some cases, the package 670 may comprise a BGA package or TSOP package. The package 670 may also comprise a stacked multi-chip package, a system-in-package (SiP), or a chip stack multichip module (MCM). As depicted, die 601 includes a pre-driver 611 that drives a delay line 631 that drives an off-chip driver 621 that drives a shared output node. In some cases, the pre-driver 611 may directly drive the off-chip driver 621 (i.e., the delay line 631 may be bypassed). Die 602 includes a pre-driver 612 that drives a delay line 632 that drives an off-chip driver 622 that drives the shared output node. In some cases, the pre-driver 612 may directly drive the off-chip driver 622 (i.e., the delay line 632 may be bypassed). Die 603 includes a pre-driver 613 that drives a delay line 633 that drives an off-chip driver 623 that drives the shared output node. In some cases, the pre-driver 613 may directly drive the off-chip driver 623 (i.e., the delay line 633 may be bypassed). The shared output node may comprise the output nodes from the three off-chip drivers 621-623 shorted together using a TSV, such as TSV 652. In some cases, the shared output node may connect to other circuitry located within the package 670.

As depicted, a TSV 651 vertically connects the output nodes from the three pre-drivers 611-613. By connecting internal nodes that are within an input path to the off-chip drivers, an off-chip driver corresponding with a selected die in a die stack may be placed in parallel with one or more off-chip drivers corresponding with unselected die of the die stack. As the off-chip driver for the selected die and other off-chip drivers from unselected die may be used to drive an output node, the sizing of the off-chip drivers may be reduced leading to a reduction in the diffusion capacitance loading the output node. For example, if die 601 is selected out of a die stack comprising die 601-603, then the active pre-driver 611 may provide signals to all three off-chip drivers 621-623. In order to prevent signal conflicts, the pre-drivers within the unselected die may be tri-stated (i.e., placed into a non-driving state). In some cases, a pre-driver may comprise one or more tri-state inverters or a tri-state buffer. In one embodiment, one or more of the off-chip drivers from the unselected die may be enabled for driving the output node (i.e., only a subset of the off-chip drivers located on the unselected die may be enabled).

In one embodiment, one or more TSVs may extend vertically from the top of a die to the bottom of the die. In another embodiment, one or more TSVs may extend from a lower metal layer (e.g., the metal layer closest to the substrate or the first routing layer) through the substrate to the bottom of the die. The connection to the portions of a lower metal layer in contact with a TSV may be made using upper metal layers and landing pads on the top most metal layer or bump pads on the top of the die. The landing pads or bump pads on the top of the die allow TSVs from a second die positioned above the die to make contact with the appropriate nodes of the die.

In some embodiments, to minimize crowbar current caused by timing discrepancies between the off-chip drivers associated with the selected and unselected die, adjustable delay lines may be added to the input paths of the off-chip drivers. In one embodiment, the input signal timing to each off-chip driver may be adjusted based on the location of the selected die within a die stack. For example, the adjustable timing delays for each of the delay lines when the selected die is the bottom die in the die stack may be different from the adjustable timing delays for each of the delay lines when the selected die is the top die in the die stack.

In some embodiments, the input signal timing for a particular off-chip driver may be adjusted based on the location of the selected die within a die stack and process variation data associated with the die (e.g., the process variation data corresponds with a process corner that has fast NMOS and slow PMOS) in which the particular off-chip driver is located.

In some cases, the adjustable delay lines in both selected and unselected die may be adjusted such that the off-chip drivers receive input signals at substantially the same time. In one example, a first delay line associated with a selected die may be set such that the delay from a pre-driver within the selected die to the input of an off-chip driver on the selected die comprises the worst-case signal delay from the pre-driver within the selected die to the input of the off-chip with the latest arriving input signal; thus, delay lines may be used to synchronize the input signal timings for the off-chip drivers located on the selected die and the unselected die. In some cases, the delay lines used for adjusting the timing of signals arriving at the off-chip drivers may be individually set such that the input arrival times of signals to the off-chip drivers are synchronized to the worst-case delay from the selected pre-driver to the farthest off-chip driver. The tweaking of the delay lines can be part of an initial calibration sequence issued by the controller after power ON.

Figure 6B:
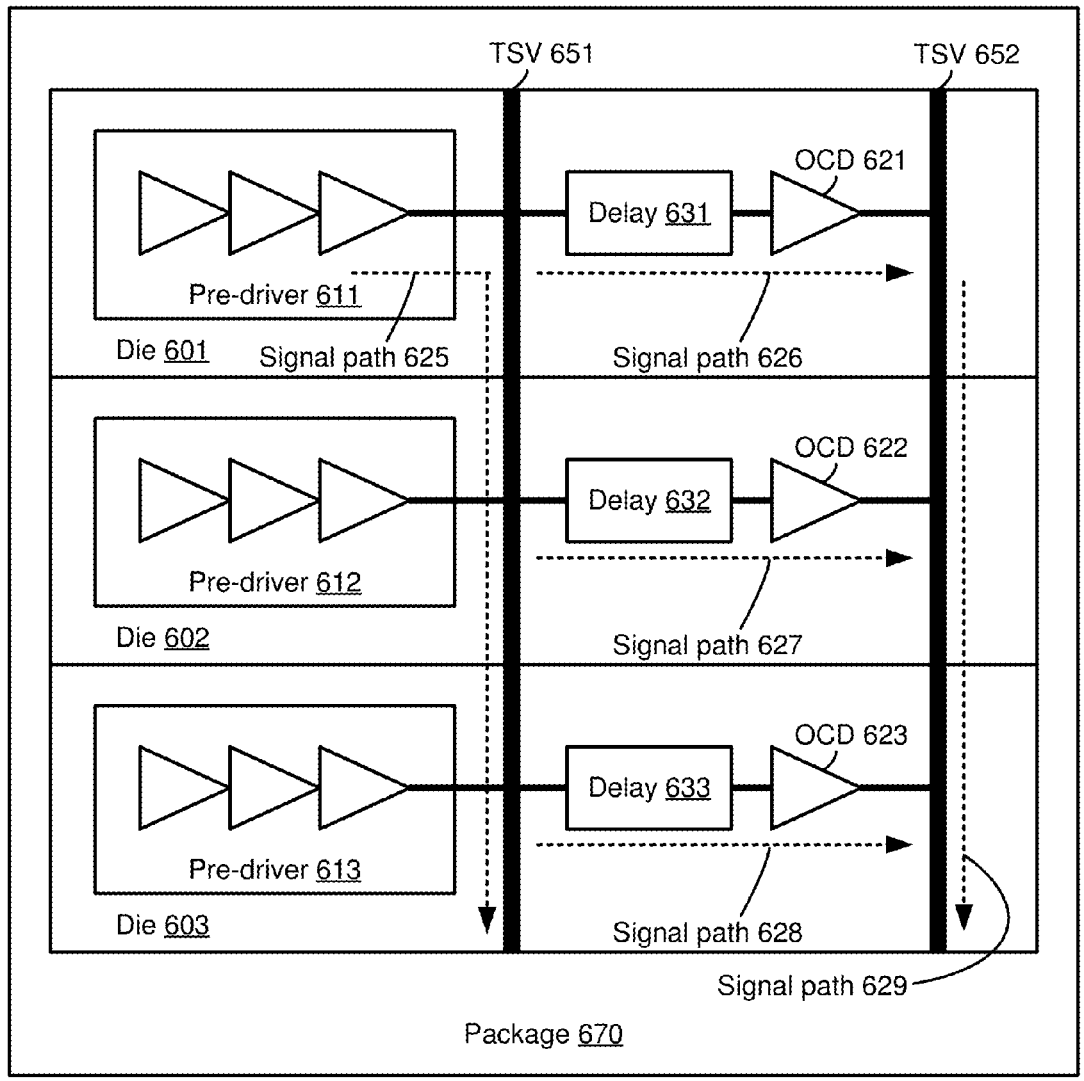
FIG. 6B depicts one embodiment including signal paths through the portion of the system depicted in FIG. 6A.

FIG. 6B depicts one embodiment including signal paths 625-629 through the portion of the system depicted in FIG. 6A. As depicted, die 601 is selected and the pre-driver 611 sends an electrical signal to delay lines 631-633 via TSV 651 corresponding with signal path 625. The delay lines 631-633 in turn drive off-chip drivers 621-623 corresponding with signal paths 626-628. The off-chip drivers 621-623 drive the TSV 652 corresponding with signal path 629.

Figure 6C:
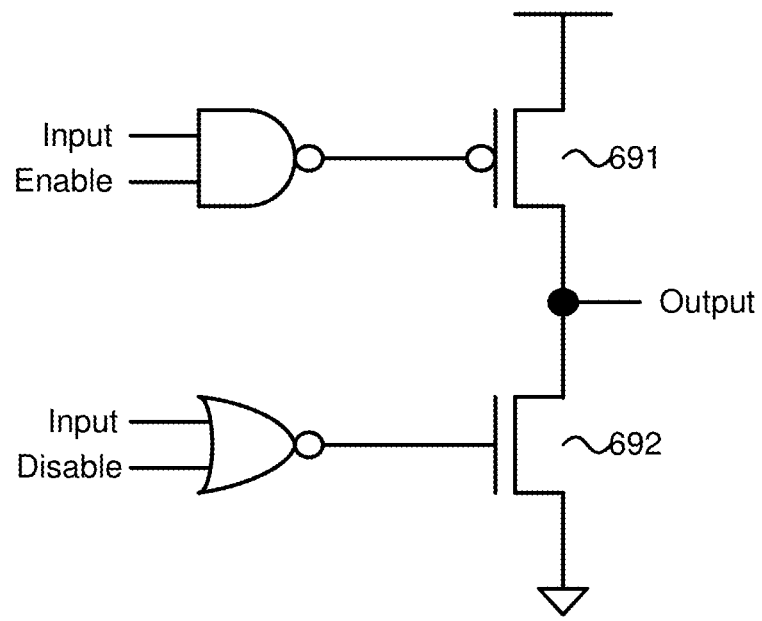
FIG. 6C depicts one embodiment of a tri-state output driver.

FIG. 6C depicts one embodiment of a tri-stateable output driver. The depicted output driver may be used as the last stage of a pre-driver, such as pre-driver 611 in FIG. 6A, or as an off-chip driver, such as off-chip driver 621 in FIG. 6A. As depicted, when enable is low (and disable is high), then the output will be floating since both PMOS 691 and NMOS 692 are placed into a non-conducting state. When enable is high (and disable is low), then the input data value will determine whether the output node is pulled high via PMOS 691 or pulled low via NMOS 692.

In one embodiment, a CMOS push-pull inverter driver may be used as an output driver. In another embodiment, an output driver may comprise a voltage-mode driver or a current-mode driver. A voltage-mode driver may comprise a low-impedance driver with two or more transistors which connect to supplies that set the output signal swing. The transistors may be sized such that they operate in the linear region of their IV curves.

Figure 6D:
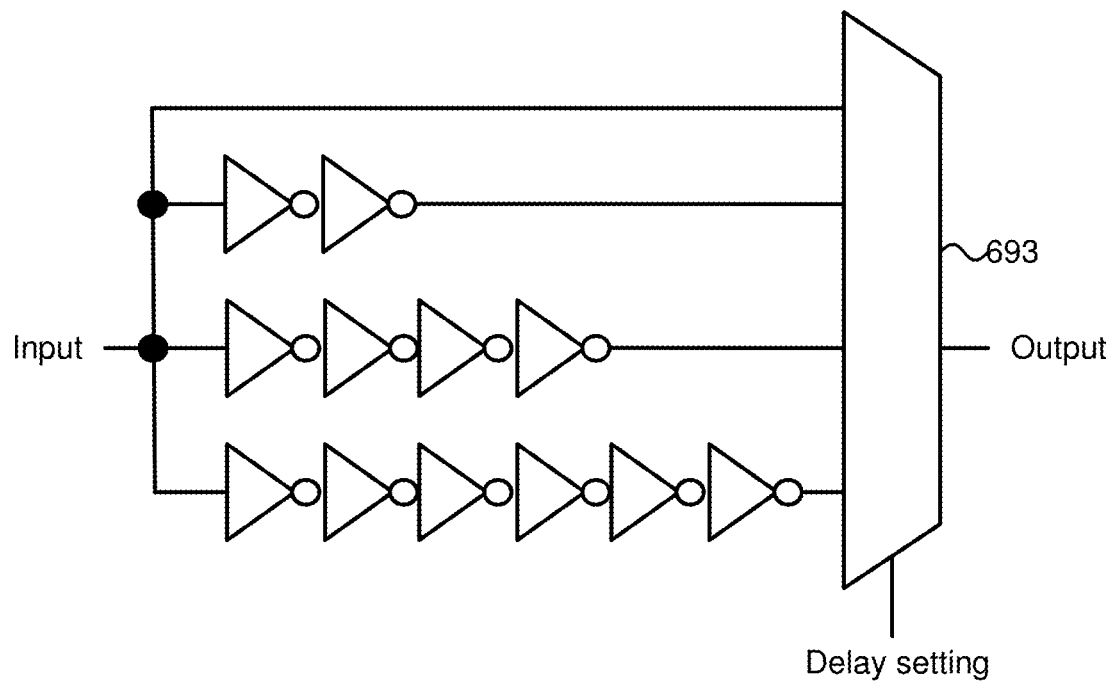
FIG. 6D depicts one embodiment of an adjustable delay line.

FIG. 6D depicts one embodiment of an adjustable delay line, such as delay line 631 in FIG. 6A. As depicted, a delay setting may be used to select one of four different delay settings using multiplexor 693. The varying signal delays may be created using active elements and/or passive elements (e.g., an RC network).

Figure 6E:
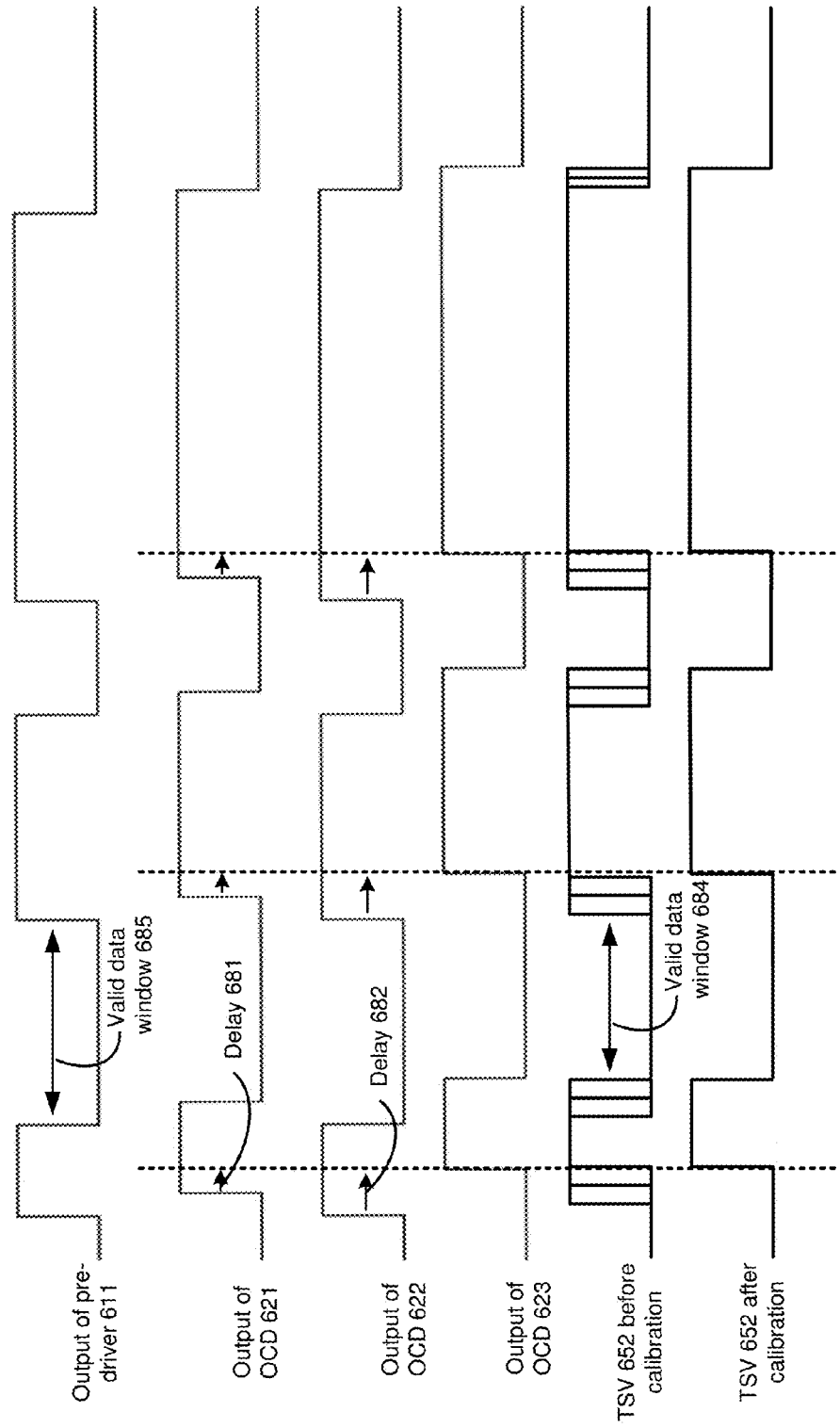
FIG. 6E depicts one embodiment of a timing diagram showing the benefits of calibrating delay lines.

FIG. 6E depicts one embodiment of a timing diagram showing the benefits of calibrating delay lines, such as delay lines 631-633 for the portion of the system depicted in FIG. 6A. Due to delay variations caused by RC delay variation along TSV 651 and die-to-die variations associated with die 601-603, the output of the off-chip drivers 621-623 may not be synchronized causing a deterioration of the output signal associated with TSV 652 and a closure of the valid data window. As depicted, the valid data window 684 has been reduced relative to the valid data window 685. In one example, due to the signal skew among the outputs of the off-chip drivers 621-623, the shape of the output waveform of TSV 652 before calibration may not correspond with the shape of the input waveform associated with the output of pre-driver 611, thereby causing a reduction in the valid data window. However, the delay lines 631-633 may be calibrated by delaying the output of off-chip driver 621 by delay 681 using delay line 631 of FIG. 6A and delaying the output of off-chip driver 622 by delay 682 using delay line 632 of FIG. 6A. After delay calibration, the output waveform of TSV 652 after calibration may correspond with a delayed version of the input waveform associated with the output of pre-driver 611, thereby maintaining the size of the valid data window. In some cases, the output waveform of TSV 652 after calibration may substantially align with the output of the off-chip driver with the latest arriving output signal (e.g., the output of off-chip driver 623 in FIG. 6E).

Figure 7:
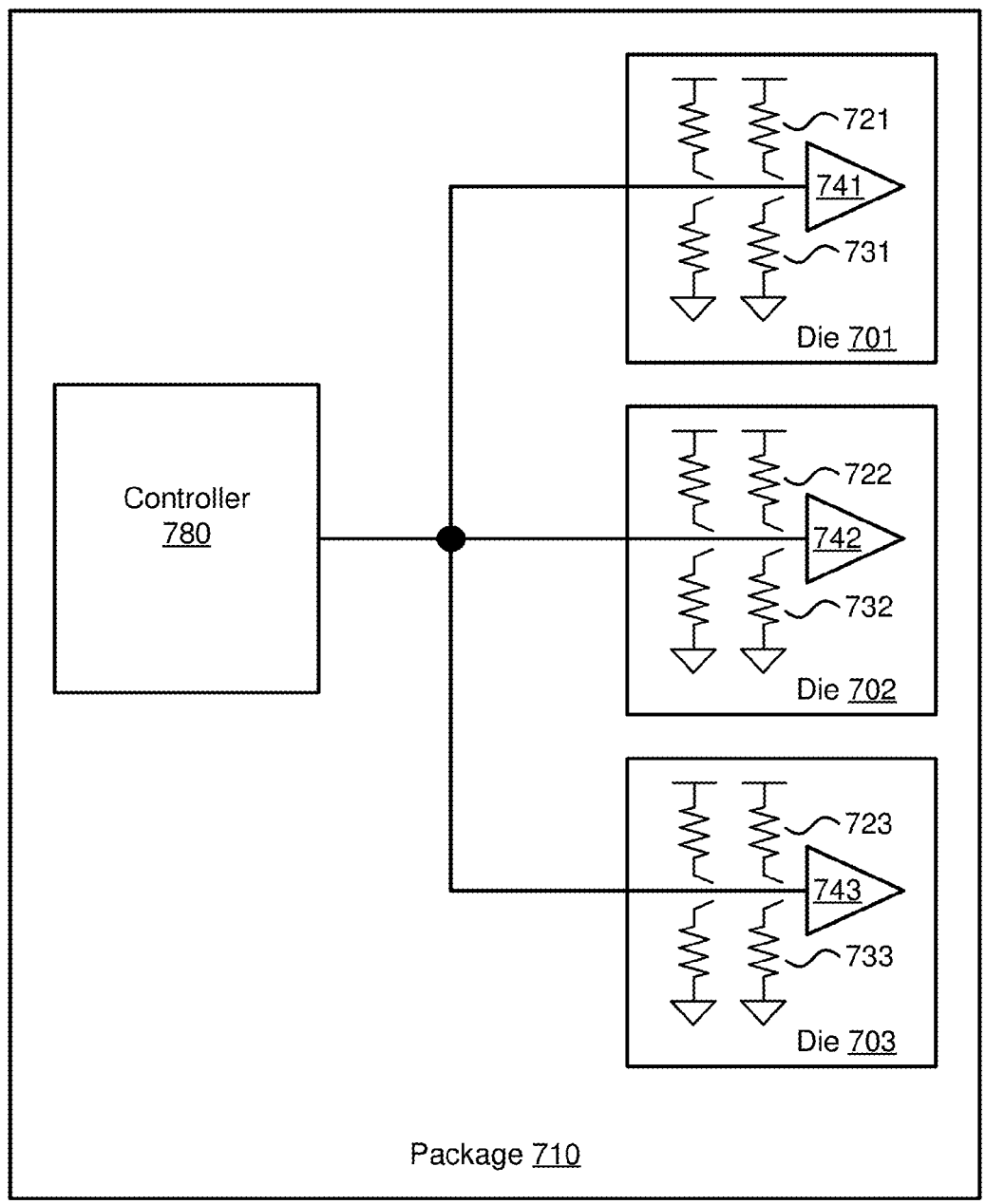
FIG. 7 depicts one embodiment of a portion of a system encased within a package.

FIG. 7 depicts one embodiment of a portion of a system, such as memory system 101 in FIG. 4A, encased within a package 710. The portion of the system comprises die 701-703. The die 701-703 may be vertically stacked within the package 710 or arranged in a horizontal manner within the package 710. In some cases, the package 710 may comprise a BGA package or TSOP package. As depicted, a controller 780, such as memory controller 105 in FIG. 4A, may provide an input signal to die 701-703. To improve impedance matching, on-die termination (ODT) resistors may be connected to each input pin or I/O pin receiving the input signal. In cases where ODT structures are included within two or more die in a die stack, the ODT structures may be shared across both the selected and unselected die. Metal options via a metal-layer masking change (e.g., changes to the top metal layer) may be used to enable or set a particular number of resistors (or a particular resistance value) within each die of the die stack. For example, in the case of a two-die stack, both die may use a first metal layer mask to provide a combined 100 ohm termination by setting the ODT structures in each die to provide a 200 ohm termination. In the case of a four-die stack, the first metal layer mask may be updated to provide a combined 100 ohm termination by setting the ODT structures in each die to provide a 400 ohm termination.

In one embodiment, each of the die in a die stack may include ODT resistors that are configurable via a metal mask change. In other embodiments, each of the die in a die stack may include ODT resistors that are configurable via the enabling or disabling of transistor switches on each die. In some cases, ODT resistors of one or more of the die within the die stack may be enabled at a given time. For example, only odd numbered die within the die stack may have their ODT resistors enabled.

Figure 8A:
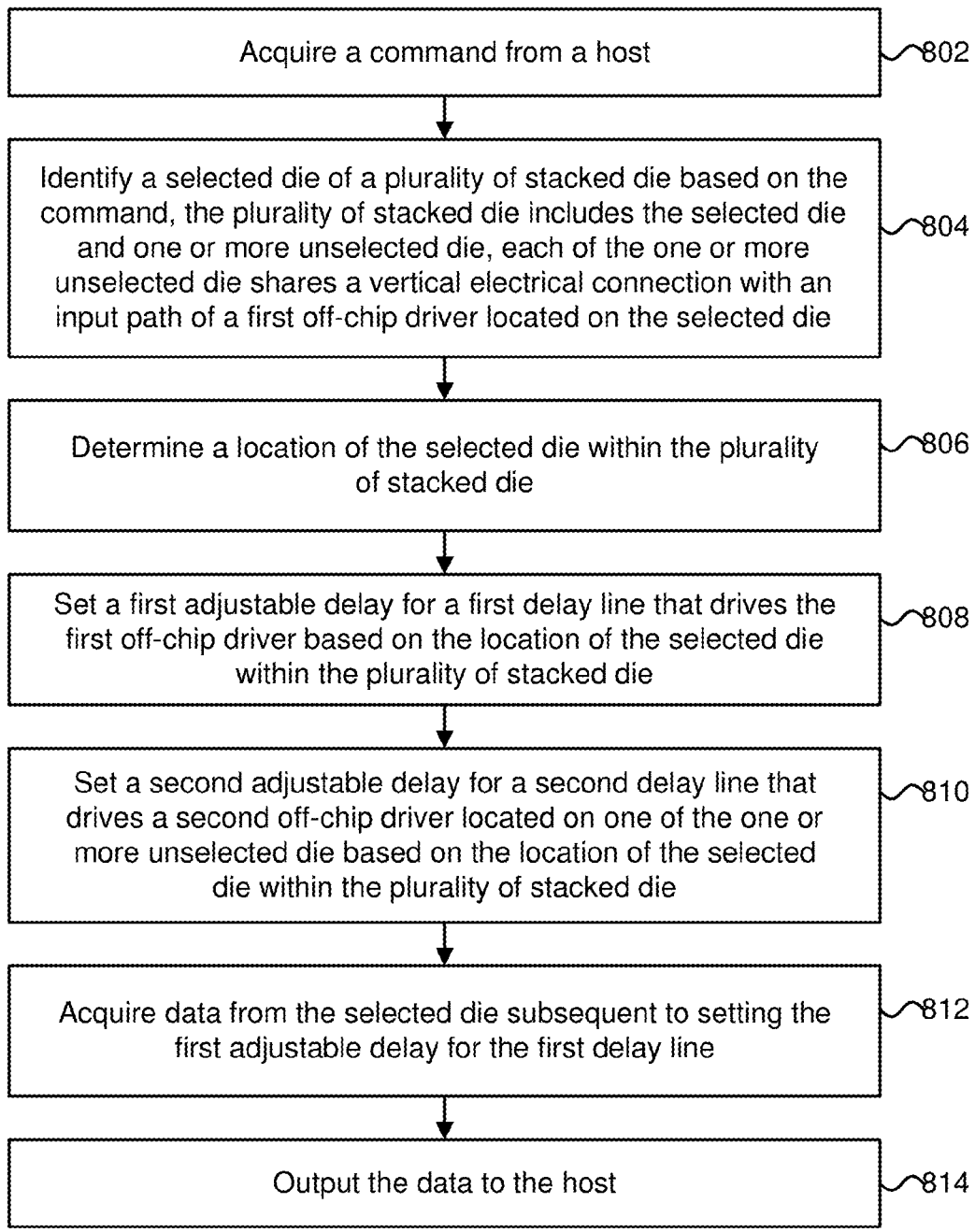
FIG. 8A is a flowchart describing one embodiment of a process for acquiring data from a memory system.

FIG. 8A is a flowchart describing one embodiment of a process for acquiring data from a memory system. In one embodiment, the process of FIG. 8A may be performed by a non-volatile storage system, such as memory system 101 in FIG. 4A.

In step 802, a command from a host is acquired. In some cases, the command may comprise a read command or a write command. The command may be decoded by a memory controller, such as memory controller 105 in FIG. 4A. In step 804, a selected die of a plurality of stacked die is identified based on the command. In one example, the selected die may be identified based on a read address associated with the command. The plurality of stacked die may include a selected die and one or more unselected die. In one embodiment, only a single die of the plurality of stacked die may be selected at any given time (e.g., data may be read from only a single die of the plurality of stacked die at a given time). The selection of die within a die stack may be mutually exclusive. Each of the one or more unselected die may share a vertical electrical connection with an input path of a first off-chip driver located on the selected die. The vertical electrical connection may comprise one or more TSVs.

In step 806, a location of the selected die within the plurality of stacked die is determined. In one example, the selected die may comprise a die that is located third from the bottom of a die stack comprising 16 total die. In step 808, a first adjustable delay for a first delay line that drives the first off-chip driver is set based on the location of the selected die within the plurality of stacked die. In step 810, a second adjustable delay for a second delay line that drives a second off-chip driver located on a second die of the one or more unselected die is set based on the location of the selected die within the plurality of stacked die. In one embodiment, the first adjustable delay may be different from the second adjustable delay. For example, the second adjustable delay may be set to a delay setting that provides a longer delay than the first adjustable delay.

In step 812, data from the selected die is acquired subsequent to setting the first adjustable delay for the first delay line and subsequent to setting the second adjustable delay for the second delay line. In one embodiment, the data from the selected die may be acquired via a read operation performed by the selected die. In step 814, the data is output to the host. In one example, the data may be transmitted to the host.

In some embodiments, given a particular selected die within a plurality of stacked die, a first adjustable delay associated with a first delay line of a first die of the plurality of stacked die and a second adjustable delay associated a second delay line of a second die of the plurality of stacked die may be determined using a calibration sequence that reduces data skew and synchronizes the arrival times of output signals from off-chip drivers associated with each of the plurality of stacked die. The calibration sequence may identify the worst-case die with the worst-case signal delay among each die in the plurality of stacked die and then set the first adjustable delay such that the arrival time of the output signals from the off-chip drivers of the first die matches the worst-case signal delay (i.e., synchronizes the arrival time of the output signals from the off-chip drivers of the first die with the arrival time of the output signals from the off-chip drivers of the worst-case die). Similarly, the second adjustable delay may be set such that the arrival time of the output signals from the off-chip drivers of the second die matches the arrival time of the output signals from the off-chip drivers of the worst-case die.

In some embodiments, a delay line calibration sequence may include sweeping a range of delay line settings for delay lines associated with each die within a plurality of stacked die and then selecting the delay line settings that best synchronize the output signals from the off-chip drivers for each of the die and/or maximizes the size of the valid data window. In some cases, in order to determine the best delay line settings for the plurality of stacked die, numerous iterations associated with varying delay line settings may be performed and a valid data window may be determined for each iteration. The best delay line settings may correspond with the iteration with the widest valid data window.

Figure 8B:
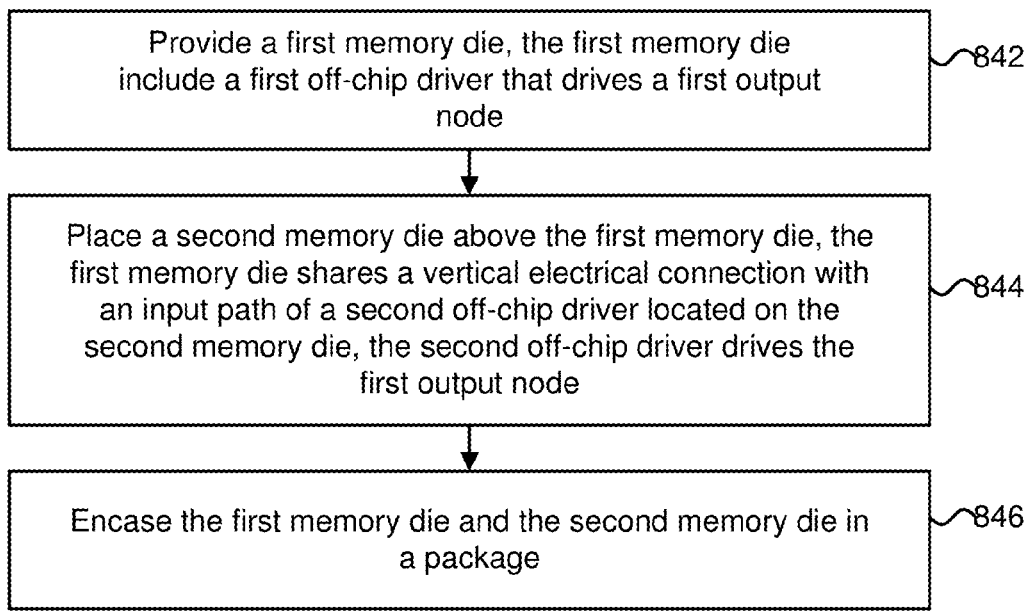
FIG. 8B is a flowchart describing one embodiment of a process for manufacturing a memory system.

FIG. 8B is a flowchart describing one embodiment of a process for manufacturing a memory system. In one embodiment, the process of FIG. 8B may be performed to manufacture a memory system, such as memory system 101 in FIG. 4A.

In step 842, a first memory die is provided. The first memory die may include a first off-chip driver that drives a first output node. The first output node may correspond with a data node for communicating data read from the first memory die. In step 844, a second memory die is placed above the first memory die and/or vertically stacked above and attached to the first memory die. The first memory die may share a vertical electrical connection with an input path of a second off-chip driver located on the second memory die. The vertical electrical connection may comprise one or more TSVs. The second off-chip driver may also drive the first output node. In some cases, the output of the second off-chip driver may be connected to the output of the first off-chip driver using a TSV. In step 846, the first memory die and the second memory die may be encased within a package. In one embodiment, the first memory die and the second memory die may both comprise flash memory die. In another embodiment, the first memory die and the second memory die may both comprise DRAM die.

In one embodiment, one or more TSVs may extend vertically from the top of the first memory die to the bottom of the first memory die. In another embodiment, one or more TSVs may extend from an internal metal layer (e.g., an internal routing layer) of the second memory die through the substrate to the bottom of the second memory die. Landing pads or bump pads may be provided on the top of the first memory die to allow one or more TSVs from the second memory die positioned above the first memory die to make contact with the appropriate internal nodes of the first memory die.

One embodiment of the disclosed technology includes identifying a selected die of a plurality of stacked die. The plurality of stacked die includes the selected die and one or more unselected die. Each of the one or more unselected die shares a vertical electrical connection with an input path of a first off-chip driver located on the selected die. The method further comprises acquiring the data from the selected die.

One embodiment of the disclosed technology includes a first memory die and a second memory die located above the first memory die. The first memory die includes a first off-chip driver and the second memory die includes a second off-chip driver. The first memory die includes a first pre-driver that is in a first input path of the first off-chip driver. The first pre-driver connects to a second input path of the second off-chip driver via a vertical electrical connection between the first memory die and the second memory die.

In some cases, the method may further comprise determining a location of the selected die within the plurality of stacked die and setting a first adjustable delay for a first delay line that drives the first off-chip driver based on the location of the selected die within the plurality of stacked die. The acquiring the data from the selected die is performed subsequent to the setting the first adjustable delay.

One embodiment of the disclosed technology includes providing a first memory die. The first memory die includes a first off-chip driver connected to a first output node. The method further comprises placing a second memory die above the first memory die. The first memory die shares a vertical electrical connection with an input path of a second off-chip driver located on the second memory die. The second off-chip driver drives the first output node.

One embodiment of the disclosed technology includes identifying a selected die of a plurality of stacked die. The plurality of stacked die includes the selected die and one or more unselected die. Each of the one or more unselected die shares a vertical electrical connection with an input path of a first off-chip driver located on the selected die. The method further includes determining a location of the selected die within the plurality of stacked die, setting a first adjustable delay for a first delay line that drives the first off-chip driver based on the location of the selected die within the plurality of stacked die, and acquiring the data from the selected die subsequent to the setting the first adjustable delay.

One embodiment of the disclosed technology includes a first memory die and a second memory die located above the first memory die. The first memory die includes a first off-chip driver and the second memory die includes a second off-chip driver. The first memory die includes a first pre-driver that is in a first input signal path of the first off-chip driver. The first pre-driver connects to a second input signal path of the second off-chip driver via a vertical electrical connection between the first memory die and the second memory die. The vertical electrical connection includes a TSV that extends vertically through a substrate of the second memory die.

One embodiment of the disclosed technology includes providing a first memory die. The first memory die includes a first off-chip driver connected to a first output node. The method further comprises placing a second memory die above the first memory die. The first memory die shares a vertical electrical connection with an input signal path of a second off-chip driver located on the second memory die. The second off-chip driver drives the first output node. The vertical electrical connection includes a TSV that extends vertically through a substrate of the second memory die.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part). The use of the terms coupled and connected may refer to a direct connection or an indirect connection.

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for acquiring data from a memory system, comprising:

identifying a selected die of a plurality of stacked die, the plurality of stacked die includes the selected die and one or more unselected die, each of the one or more unselected die shares a vertical electrical connection with an input path of a first off-chip driver located on the selected die;

determining a location of the selected die within the plurality of stacked die;

setting a first adjustable delay for a first delay line that drives the first off-chip driver based on the location of the selected die within the plurality of stacked die; and acquiring the data from the selected die subsequent to the setting the first adjustable delay.

2. The method of claim 1, wherein:

the setting the first adjustable delay includes setting the first adjustable delay based on the location of the selected die within the plurality of stacked die and process variation data associated with the selected die.

3. The method of claim 1, further comprising:

setting a second adjustable delay for a second delay line that drives a second off-chip driver located on a second die of the one or more unselected die based on the location of the selected die within the plurality of stacked die, the acquiring the data from the selected die is performed subsequent to the setting the first adjustable delay and subsequent to the setting the second adjustable delay.

4. The method of claim 3, wherein:
the first adjustable delay is different from the second adjustable delay.

5. The method of claim 3, wherein:
the first adjustable delay is greater than the second adjustable delay.

6. The method of claim 1, wherein:
the vertical electrical connection comprises one or more TSVs.

7. The method of claim 1, wherein:
the vertical electrical connection comprises a TSV that extends vertically through a substrate of the selected die.

8. The method of claim 1, wherein:
the selected die is the only die selected during the acquiring the data from the selected die.

9. The method of claim 1, wherein:
the input path of the first off-chip driver includes an output from a first pre-driver located on the selected die, the output of the first pre-driver is connected to the vertical electrical connection.

10. The method of claim 9, wherein:
the output of the first pre-driver is connected to the first delay line.

11. The method of claim 1, wherein:
the input path of the first off-chip driver includes an output from a first pre-driver located on the selected die, the output of the first pre-driver is connected to the vertical electrical connection, a second die of the one or more unselected die includes a second delay line driving a second off-chip driver, the vertical electrical connection is connected to the first delay line and the second delay line.

12. The method of claim 1, wherein:
a second die of the one or more unselected die includes a second delay line driving a second off-chip driver, the first off-chip driver drives a first output, the second off-chip driver drives the first output, the vertical electrical connection is connected to the first delay line that drives the first off-chip driver, the vertical electrical connection is connected to the second delay line that drives the second off-chip driver.

13. The method of claim 1, wherein:
each of the plurality of stacked die are vertically stacked within a package.

14. The method of claim 1, wherein:
the selected die and the one or more unselected die are semiconductor memory die.

15. A method for manufacturing a non-volatile storage system, comprising:
providing a first memory die, the first memory die includes a first off-chip driver connected to a first output node; and
placing a second memory die above the first memory die, the second memory die includes a second off-chip driver connected to the first output node, the first memory die shares a vertical electrical connection with an input signal path of the second off-chip driver, the input signal path of the second off-chip driver includes a second pre-driver, the second pre-driver drives the vertical electrical connection, the vertical electrical connection includes a TSV that extends vertically through a substrate of the second memory die.

16. The method of claim 15, further comprising:
encasing the first memory die and the second memory die in a package, the second memory die is vertically stacked above the first memory die, the second memory die is bonded to the first memory die.

17. The method of claim 15, wherein:
the vertical electrical connection comprises one or more TSVs.

18. The method of claim 15, wherein:
the input signal path of the second off-chip driver includes the second pre-driver driving a second delay line, the second delay line drives the second off-chip driver.

19. The method of claim 15, wherein:
the input signal path of the second off-chip driver includes the second pre-driver and a configurable delay line located on the second memory die, the first memory die and the second memory die are part of a die stack, a signal delay of the configurable delay line is set based on a location of the second memory die within the die stack.

* * * * *